United States Patent
Sakamoto

(10) Patent No.: US 7,237,316 B2
(45) Date of Patent: Jul. 3, 2007

(54) METHOD FOR FABRICATING A THREE-DIMENSIONAL ACCELERATION SENSOR

(75) Inventor: Akihiro Sakamoto, Miyazaki (JP)

(73) Assignee: Oki Electronics Industry Co., Ltd., Tokyo (JP)

( * ) Notice: Subject to any disclaimer, the term of this patent is extended or adjusted under 35 U.S.C. 154(b) by 0 days.

(21) Appl. No.: 11/182,844

(22) Filed: Jul. 18, 2005

(65) Prior Publication Data

US 2007/0017289 A1    Jan. 25, 2007

(51) Int. Cl.
  *G01R 3/00* (2006.01)
(52) U.S. Cl. .................. 29/595; 29/592.1; 73/514.16; 257/414; 427/79; 427/80; 438/50; 438/51; 438/52
(58) Field of Classification Search ............... 29/592.1, 29/595; 73/514.16; 257/414; 427/79, 80; 438/50–52
See application file for complete search history.

(56) References Cited

U.S. PATENT DOCUMENTS 4,882,933 A * 11/1989 Petersen et al. ......... 73/514.13
5,349,858 A * 9/1994 Yagi et al. ................ 73/514.02
5,504,032 A * 4/1996 Gessner et al. ................ 438/52
6,557,414 B2 * 5/2003 Sakurai et al. ........... 73/504.04
6,997,054 B2 * 2/2006 Tsugai ..................... 73/504.12

FOREIGN PATENT DOCUMENTS

JP          09061457 A    *  3/1997
JP       2004-198243         7/2004

OTHER PUBLICATIONS

"A high performance, variable capacitance accelerometer"; Wilner, L.B.; Instrumentation and Measurement, IEEE transactions on vol. 37, Issue 4; Dec. 1988; pp. 569-571.*

* cited by examiner

*Primary Examiner*—Paul D. Kim
(74) *Attorney, Agent, or Firm*—Rabin & Berdo, PC

(57) ABSTRACT

According to the present invention, a method for fabricating a three-dimensional acceleration sensor, comprising: providing a semiconductor substrate having first and second surfaces; forming an insulating layer on the first surface of the semiconductor substrate; forming an active layer on the insulating layer; forming a plurality of openings on the active layer at a first region, which is to be located above a movable mass with a predetermined space; selectively removing the insulating layer located under the first region in a wet-etching process through the plurality of openings; and selectively removing the active layer to form a groove separating the first region from a movable mass.

24 Claims, 8 Drawing Sheets

METHOD FOR FABRICATING A THREE-DIMENSIONAL ACCELERATION SENSOR

TECHNICAL FIELD OF THE INVENTION

The present invention relates generally to a three-dimensional acceleration sensor (accelerometer) using MEMS (Micro Electro mechanical Systems) technology, which detects physical movement of a movable mass.

BACKGROUND OF THE INVENTION

According to a type of accelerometer using a piezoresistive effect, may include a box shape of seismic mass (i.e. movable mass), contained in a cavity of a silicon base member. The movable mass is suspended by beams on which a piezoresistance are formed, so that a stress is applied to the piezoresistance in response to movement of the movable mass. The variation of stress applied to the piezoresistance is detected as a variation of resistance.

The above-described mass is required to move freely, however, if the mass over-moves, the sensor might be broken or damaged. For inhibiting over-move of the mass, a stopper is arranged above the moving mass with a predetermined space (distance).

In fabrication of such an acceleration sensor, an insulating layer is formed on a silicon substrate and an active layer is formed on the insulating layer. A plurality of piezoresistances is formed on the active layer. A stopper is formed as a part of the active layer. According to a conventional acceleration sensor described in Japanese Patent Application Publication No. 2004-198243, stoppers are provided with holes and the active layer is provided with a groove separating a movable mass, beams, a stationary frame and the stoppers from each other in a horizontal plane.

The holes are formed on the stopper regions in the same process as forming the groove of the active layer. After that, the insulating layer, located between the stoppers and the movable mass, is selectively removed to separate the stopper from the movable mass in a vertical direction by a wet-etching process. Such a wet-etching process is carried out through the holes on the stoppers.

According to the above described conventional acceleration sensor, however, electronic elements including the piezoresistances and conductive wiring formed on the active layer may be damaged in the wet-etching process, because a wet-etching process takes a long time to be completed.

OBJECTS OF THE INVENTION

Accordingly, an object of the present invention is to provide a three-dimensional acceleration sensor in which damages caused by a wet-etching process can be reduced.

Another object of the present invention is to provide a method for fabricating a three-dimensional acceleration sensor in which damages caused by a wet-etching process can be reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method for fabricating a three-dimensional acceleration sensor, comprising: providing a semiconductor substrate having first and second surfaces; forming an insulating layer on the first surface of the semiconductor substrate; forming an active layer on the insulating layer; forming a plurality of openings on the active layer at a first region, which is to be located above a movable mass with a predetermined space; selectively removing the insulating layer located under the first region in a wet-etching process through the plurality of openings; and selectively removing the active layer to form a groove separating the first region from a movable mass.

According to a second aspect of the present invention, a three-dimensional acceleration sensor, comprising: a semiconductor substrate having first and second surfaces; an insulating layer, formed on the first surface of the semiconductor substrate; and an active layer, formed on the insulating layer. The active layer comprises; a plurality of openings thereon at a first region, which is located above a movable mass with a predetermined space; and a groove separating the first region from the movable mass. The insulating layer is removed from a region under the first region in a wet-etching process through the plurality of openings. The insulating layer is partly remained within the groove so that the insulating layer comprises an extended region, which extends from the movable mass toward the first region.

The first region may be a stopper, which restricts over-move of the movable mass. The movable mass may be shaped to have corners, and the stopper may include a plurality of members arranged around the corners of the movable mass. The openings may be shaped to be square.

Preferably, the active layer is removed also to separate the movable mass from a stationary frame and to shape beams, which are coupled between the movable mass and the stationary frame. A glass plate, for example, pyrex glass, can be bonded onto the second surface of the semiconductor substrate. Preferably, the glass plate is provided before forming the plurality of openings on the active layer in an anodic bonding process.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
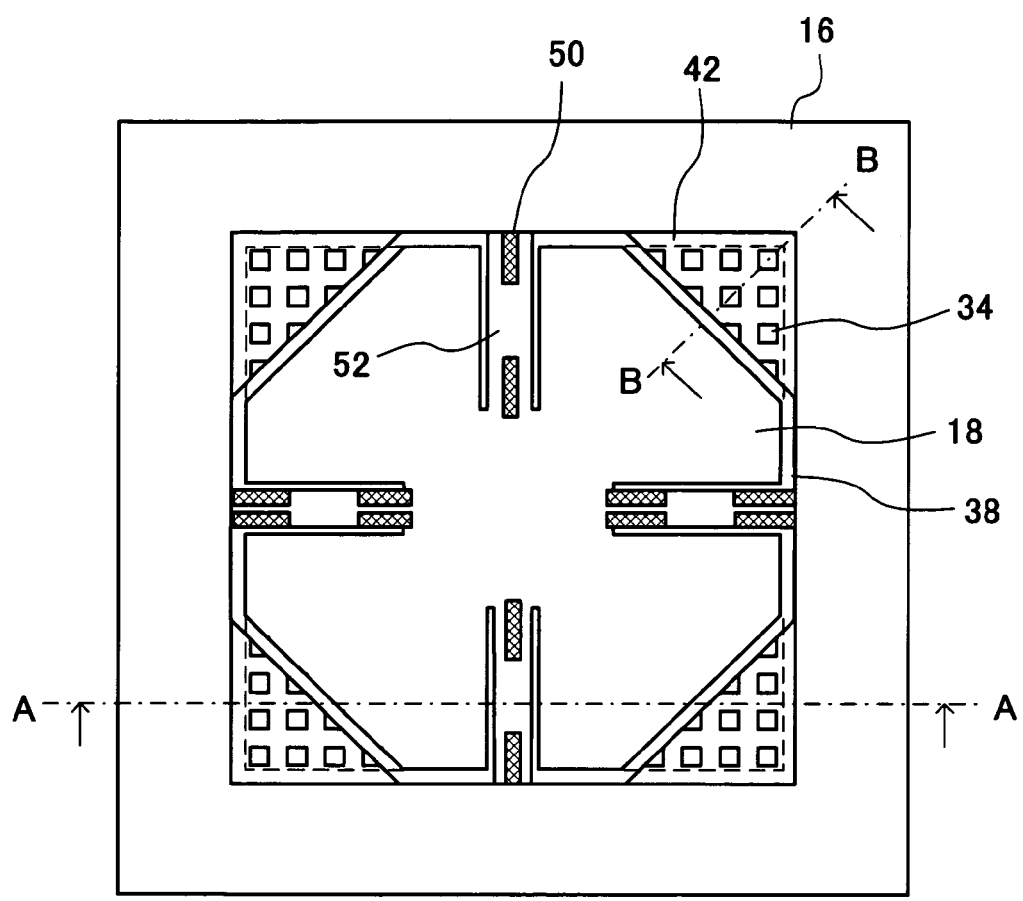
FIG. 1 is a plane view illustrating a three-dimensional acceleration sensor according to the present invention.
Figure 2:
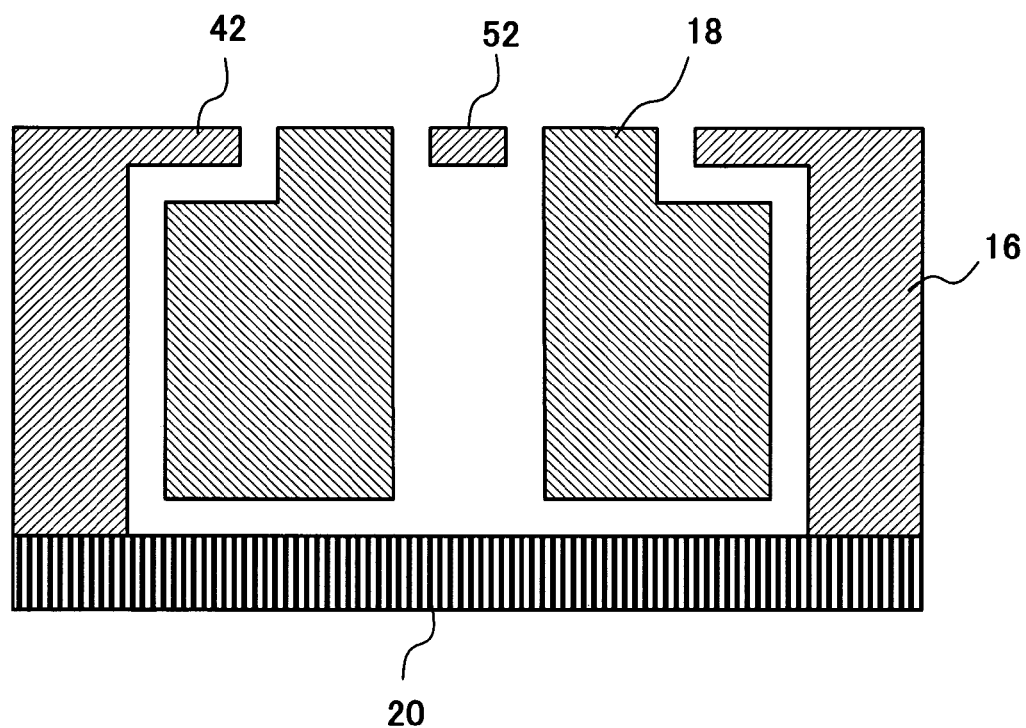
FIG. 2 is a cross-sectional view taken on line A—A in FIG. 1.

FIG. 1 is a plane view illustrating a three-dimensional acceleration sensor according to the present invention. FIG. 2 is an outline cross-sectional view taken on line A—A in FIG. 1. A three-dimensional acceleration sensor according to the present invention is shaped to be square, as shown in FIG. 1, and is fabricated using MEMS (Micro Electro mechanical Systems) technology. The acceleration sensor is designed to detect physical movement of a movable mass (seismic mass) 18 using a piezoresistive effect. The acceleration sensor can be used for acceleration, vibration, angle of inclination and so on. The acceleration sensor can be used, for example, in a mobile phone, toys and other variety of devices.

The acceleration sensor includes a stationary frame 16, the movable mass 18, a pyrex glass plate 20, beams 52, stoppers 42 and twelve piezoresistances 50. The pyrex glass plate 20 is arranged on the bottom of the sensor. The movable mass 18 is shaped to be a box and is contained in a cavity of a silicon base member (stationary frame 16). The movable mass 18 is suspended by beams 52 on which the piezoresistances 50 are formed, so that a stress is applied to the piezoresistances 50 in response to movement of the movable mass 18. The variation of stress applied to the piezoresistances 50 is detected as a variation of resistance.

The movable mass 18 is required to move freely, however, if the mass 18 over-moves upwardly, the sensor might be broken or damaged. For inhibiting over-move of the mass 18, the stoppers 42 are arranged above the movable mass 18 with a predetermined space (distance). For example, when upward motion of the movable mass 18 exceeds a detectable range of ±3G of the sensor, the stoppers 42 would strict the over-move of the movable mass 18.

The stoppers 42 are shaped triangle and are located around the every corner of the movable mass 18. Each stopper 42 is provided with a number of square openings (holes) 34. The movable mass 18 is separated by a groove 38 from the stationary frame 16, beams 52 and stoppers 42 in a horizontal plane. The openings can be other shapes, for example, slits, round, triangle, oval and so on.

For inhibiting downward over-move of the mass 18, the glass plate 20 is arranged below the movable mass 18 with a predetermined space (distance). For example, when downward motion of the movable mass 18 exceeds a detectable range of ±3G of the sensor, the glass plate 20 would strict the over-move of the movable mass 18. It is noted that the glass plate 20 can be omitted in another embodiment, in accordance with a mounting condition of the sensor.

Figure 4:
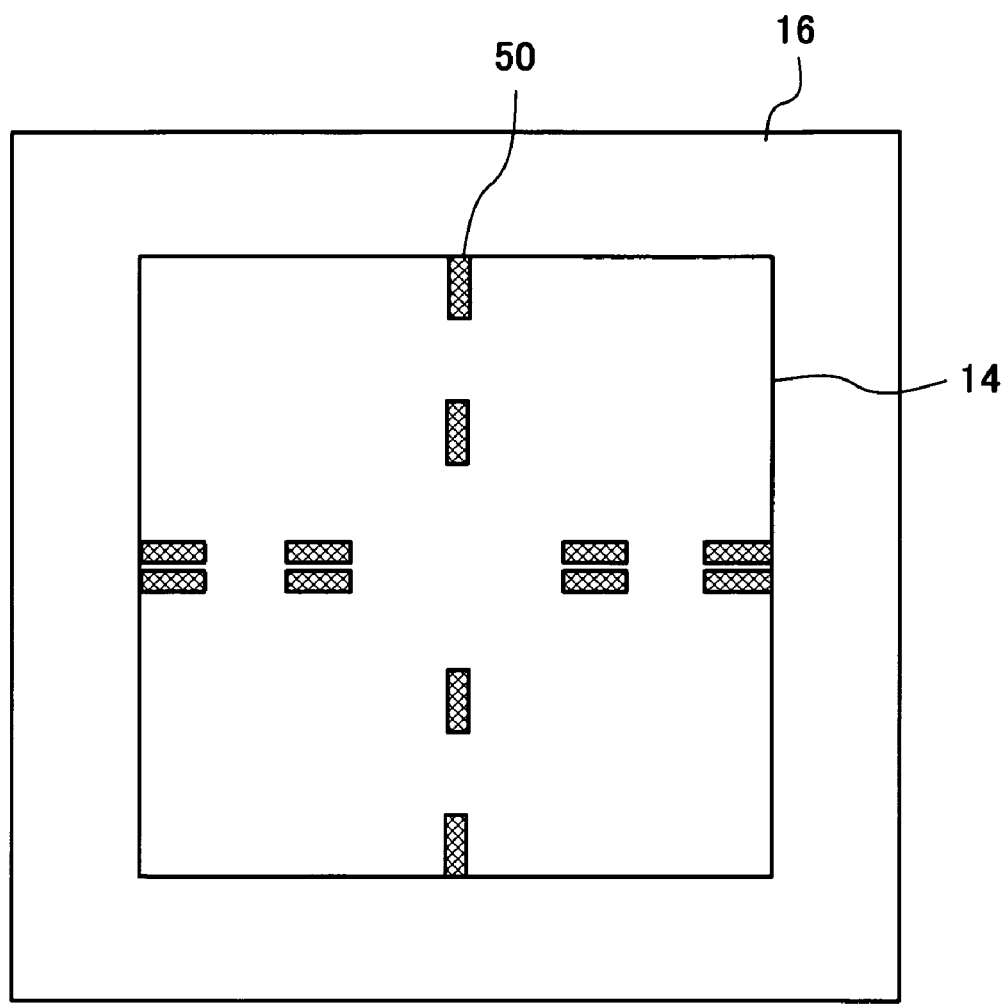
FIG. 4 is a plane view illustrating a three-dimensional acceleration sensor under fabrication, corresponding to a step shown in FIG. 3C.
Figure 5:
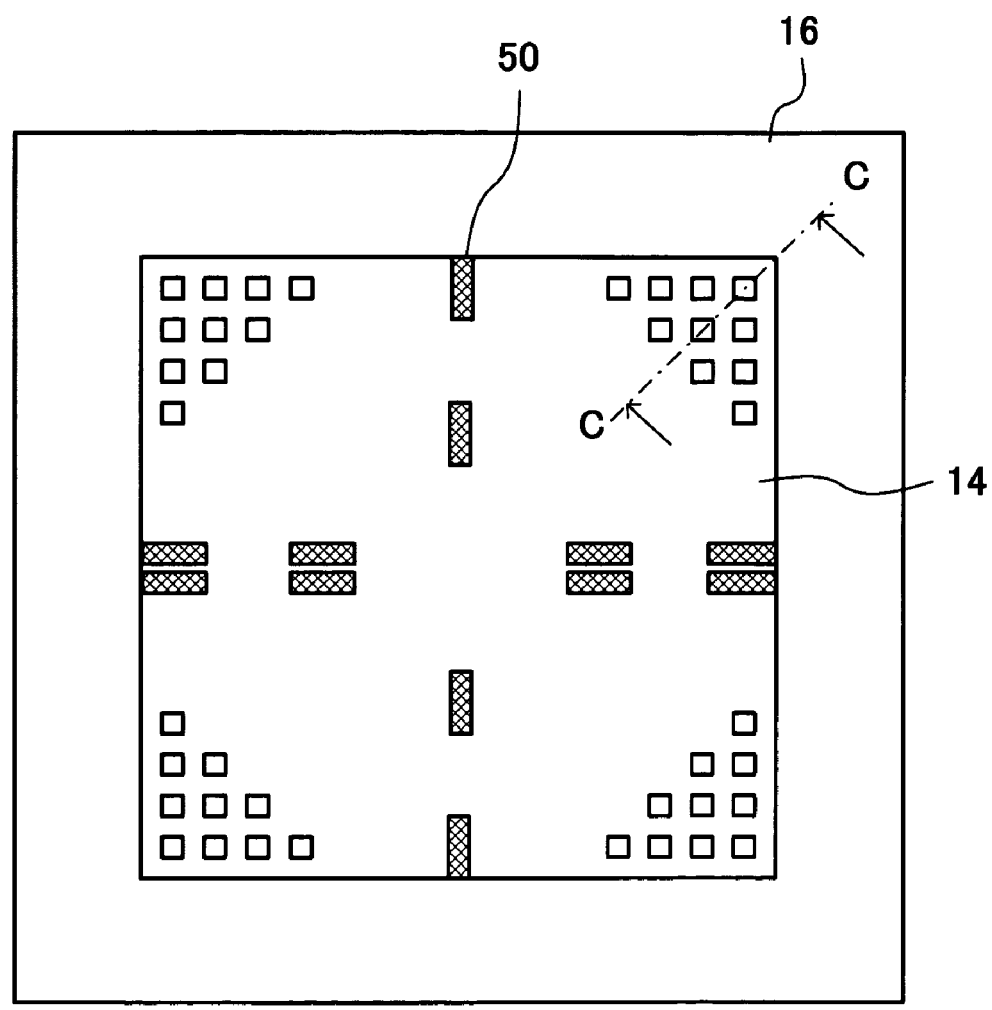
FIG. 5 is a plane view illustrating a three-dimensional acceleration sensor under fabrication, corresponding to a step shown in FIG. 3G.

FIGS. 3A–3J are cross-sectional views showing fabrication steps of the three-dimensional acceleration sensor according to the present invention. FIGS. 3A–3J essentially correspond to cross-sections taken on line B—B in FIG. 1. FIGS. 4 and 5 are plane views illustrating the acceleration sensor under fabrication, corresponding to steps shown in FIGS. 3C and 3G, respectively.

Figure 3A:
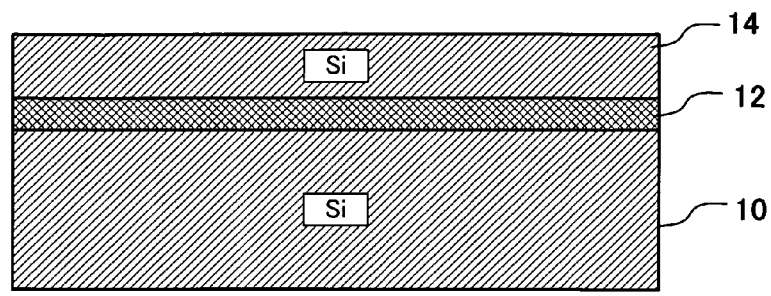
FIGS. 3A–3J are cross-sectional views showing fabrication steps of a three-dimensional acceleration sensor according to the present invention.

Referring to FIG. 3A, an insulating layer (silicon oxide) 12 is formed on a silicon substrate 10 and an active layer 14 of silicon is formed on the insulating layer 12 to form a SOI (Silicon On Insulator) type of wafer. After that, piezoresistances, a wiring pattern, electrodes and other necessary electrical elements, not shown, are formed on the active layer 14.

Figure 3B:
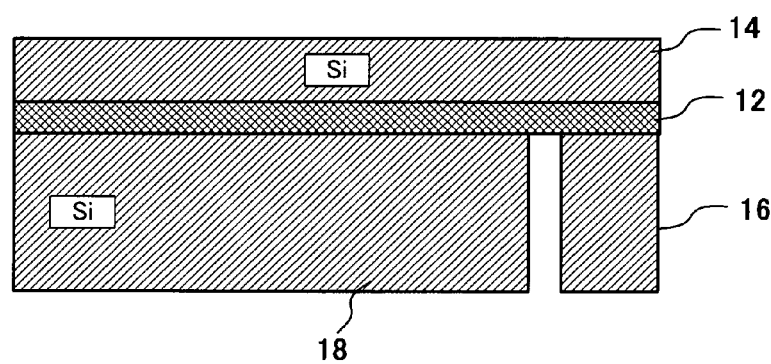

Next, as shown in FIG. 3B, a movable mass 18 and a stationary frame 16 are shaped by a dry etching process, which is carried out from the bottom of the silicon substrate 10.

Figure 3C:
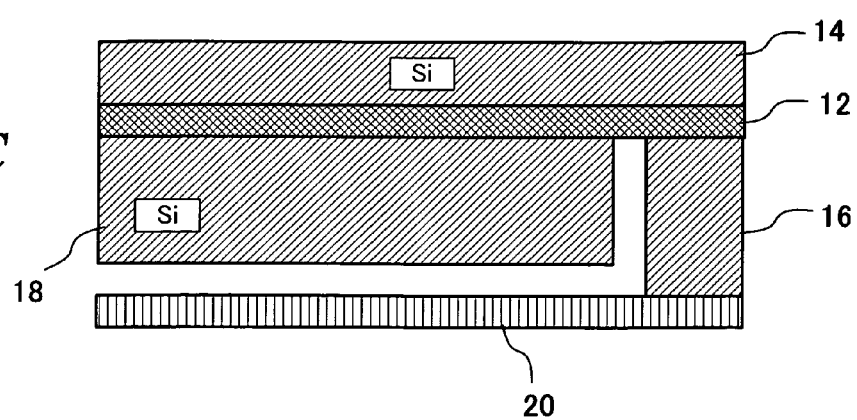

Subsequently, as shown in FIG. 3C, a pyrex glass plate 20 is bonded onto the bottom surface of the silicon substrate 10 by an anodic bonding process to have a predetermined space from the movable mass 18. Such a bonding process is usually carried out while the wafer is in-vacuum condition, so that the inside of the wafer would be under a low-pressure condition. The pyrex glass plate 20 is functioning to restrict downward over-move of the movable mass 18.

Figure 3D:
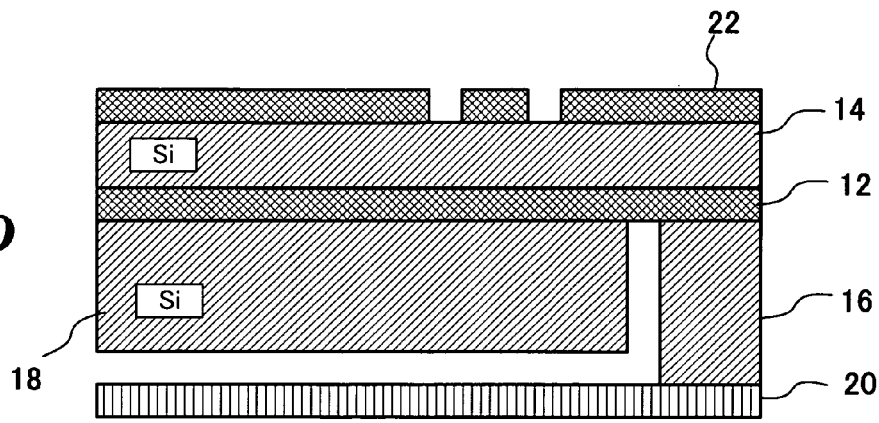
Figure 3E:
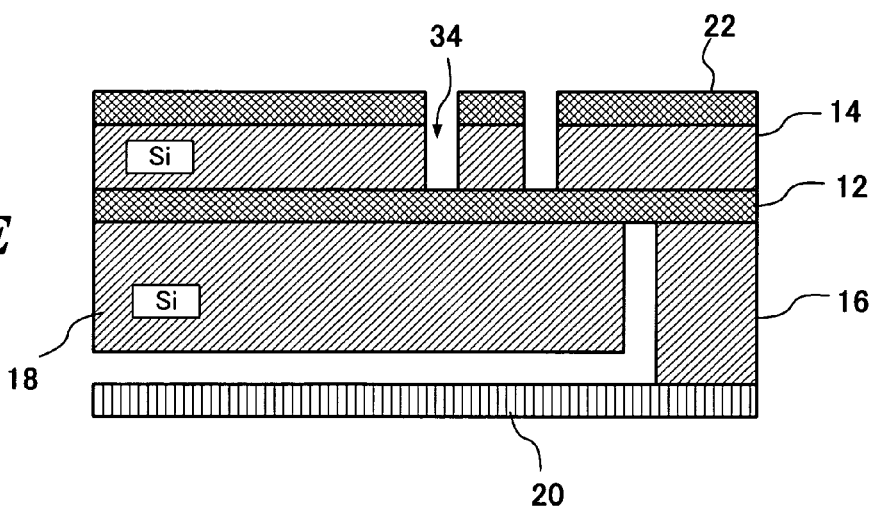

Referring to FIGS. 3D and 3E, an etching mask 22 (photo resist) is formed on the active layer 14 and the active layer 14 is selectively etched to form a number of holes 34 on the active layer 14. The holes 34 are formed at a first region, which is to be stoppers 42, shown in FIG. 1. The holes 34 are formed by dry-etching the active layer 14 of 5–10 μm. Such dry-etching is terminated at the insulating layer 12. Preferably, a detecting device to detect motion of the movable mass 18 and output an electrical signal corresponding to a degree of the motion may be formed before forming the holes 34.

When the holes 34 are formed, the inside pressure of the wafer and the outside pressure are adjusted to each other gradually, so that the sensor is prevented from being damaged due to a rapid pressure-change. According to the conventional sensor, described in Japanese Patent Application Publication No. 2004-198243, holes on stoppers and a groove, separating a movable mass, a stationary frame, beams and the stoppers, are formed at the same time, so that a rapid pressure change occurs and the sensor would be damaged.

Figure 3F:
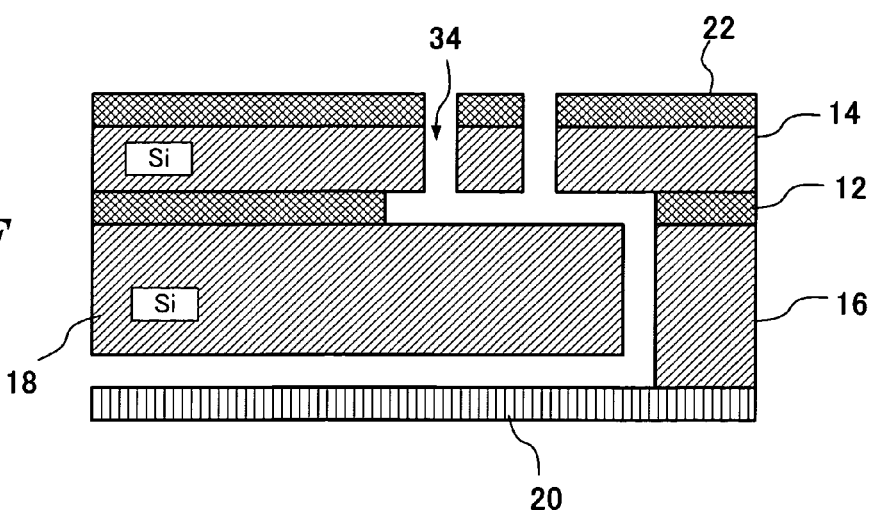
Figure 3G:
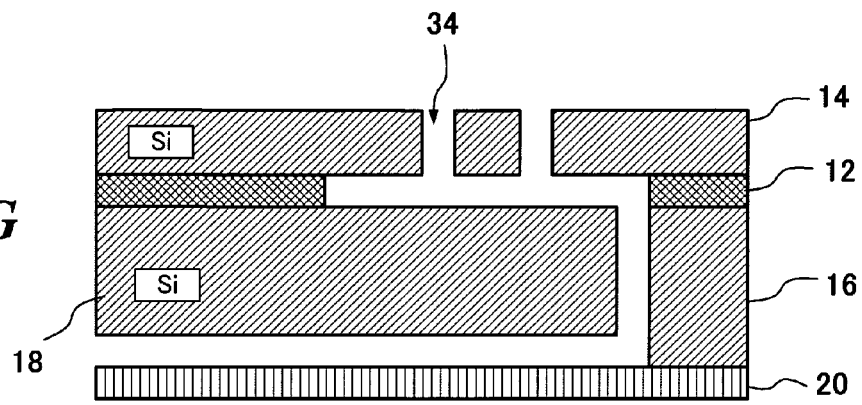

Next, referring to FIG. 3F, the insulating layer 12 is selectively removed by a wet etching process with HF system of etchant through the holes 34 while the mask (photo resist) remains on the active layer 14. In this process, the insulating layer 12 is removed from an area below the holes 34 and its peripheral, as shown in FIG. 3F. The etching condition should be controlled so that the insulating layer 12 is well etched out. After that, as shown in FIG. 3G, the photo resist 22 is removed.

Figure 3H:
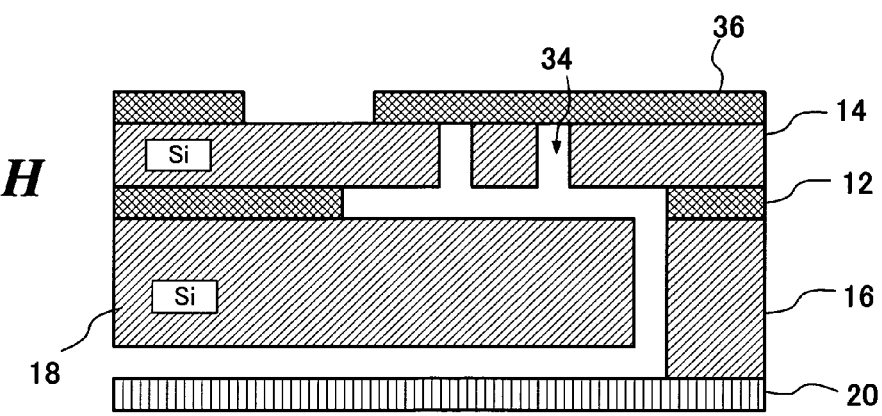
Figure 3I:
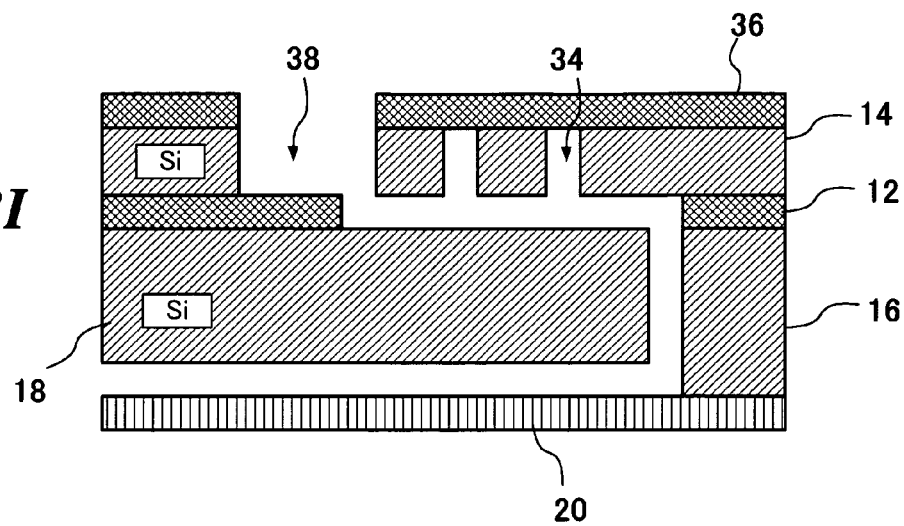
Figure 3J:
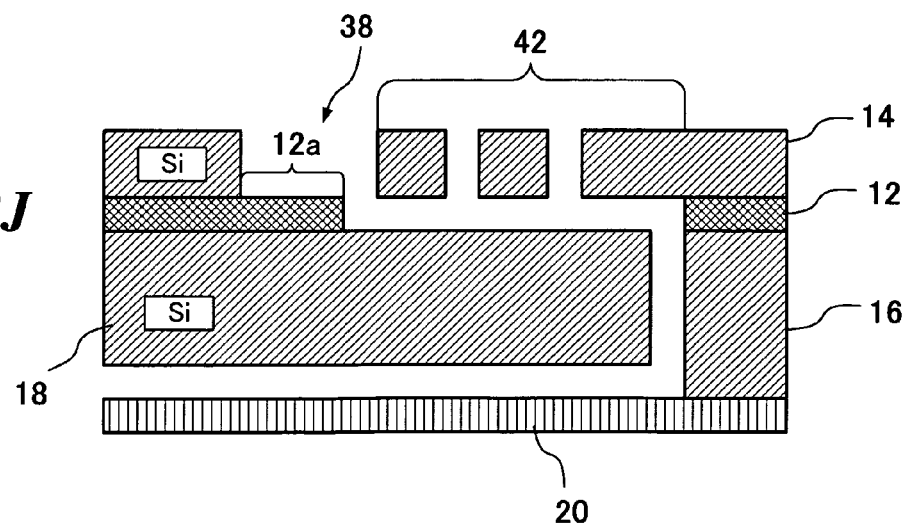

Now referring to FIG. 3H, another photo resist layer is formed on the active layer 14 and is shaped to form an etching mask 36. Subsequently, as shown in FIG. 3I, the active layer 14 is selectively removed by a dry-etching process using the mask 36 to form a groove 38. The groove 38 separates the movable mass 18, the stationary frame 16, the beams 52 and the stoppers 42 from each other. In such a dry-etching process, the photo resist layer 36 covers the holes 34, each having a diameter some μm (1–9 μm) and a depth of 5–10 μm. The photo resist layer 36 should have a relatively higher viscosity and be formed by a spray coating technique not by a spin coating technique to cover well all the area that should not be etched.

The boundary between the movable mass 18 and the stoppers 42 is determined so that the insulating layer 12 has an extended portion 12a, which extends within the groove 38 from the movable mass 18 toward the stoppers 42 but does not reach the stoppers 42. It is clear in FIG. 1, the active layer 14 is etched over the inner most holes 42 so that groove 38 is overlapped an inner part of the holes 42. As a result, the movable mass 18, the stationary frame 16, the beams 52 and the stoppers 42 are separated from each other only by an etching process of the active layer 14, It should be noted that the present invention is not only applied to a sensor having a stopper but also to other types of sensors as long as the sensor includes a specific region (first region) of an active layer, which is to be located above a movable mass with a predetermined space.

What is claimed is:

1. A method for fabricating a three-dimensional acceleration sensor, comprising:
   providing a semiconductor substrate having first and second surfaces;
   forming an insulating layer on the first surface of the semiconductor substrate;
   forming an active layer on the insulating layer;
   selectively removing a portion of the semiconductor substrate so as to define a first boundary of a movable mass;
   forming a plurality of openings in the active layer at a first region, the first region being located above the movable mass and occupying a predetermined space;
   selectively removing a portion of the insulating layer located under the first region in a wet-etching process through the plurality of openings so as to define a second boundary of the movable mass; and
   after said forming a plurality of openings, selectively removing a portion of the active layer to form a groove separating the first region from the movable mass, so as to define a third boundary of the movable mass, wherein the movable mass comprises a remaining portion of the semiconductor substrate, a remaining portion of the insulating layer, and a remaining portion of the active layer.

2. The method for fabricating a three-dimensional acceleration sensor, according to claim 1, wherein
   the first region is a stopper which restricts over-move of the movable mass.

3. The method for fabricating a three-dimensional acceleration sensor, according to claim 2, wherein
   the movable mass is shaped to have corners, and
   the stopper comprises a plurality of members arranged around the corners of the movable mass.

4. The method for fabricating a three-dimensional acceleration sensor, according to claim 1, wherein
   the openings are shaped to be square.

5. The method for fabricating a three-dimensional acceleration sensor, according to claim 1, wherein
   the step of selectively removing the active layer is carried out also to separate the movable mass from a stationary frame and to shape beams which are coupled between the movable mass and the stationary frame.

6. The method for fabricating a three-dimensional acceleration sensor, according to claim 1, further comprising:
   before forming the plurality of openings, forming a detecting device to detect motion of the movable mass and output an electrical signal corresponding to a degree of the motion.

7. The method for fabricating a three-dimensional acceleration sensor, according to claim 1, further comprising:
   providing a glass plate on the second surface of the semiconductor substrate.

8. The method for fabricating a three-dimensional acceleration sensor, according to claim 7, wherein
   the step of providing a glass plate is carried out before forming the plurality of openings on the active layer.

9. The method for fabricating a three-dimensional acceleration sensor, according to claim 7, wherein
   the step of forming a glass plate is carried out in an anodic bonding process.

10. The method for fabricating a three-dimensional acceleration sensor, according to claim 7, wherein
    the glass plate is pyrex glass.

11. The method for fabricating a three-dimensional acceleration sensor, according to claim 7, wherein
    the insulating layer is partly remained within the groove so that the insulating layer comprises an extended region, which extends from the movable mass toward the first region.

12. The method for fabricating a three-dimensional acceleration sensor, according to claim 7, wherein
    the step of providing a glass plate is carried out in vacuum condition.

13. A method for fabricating a three-dimensional acceleration sensor, comprising:
    providing a semiconductor substrate having first and second surfaces;
    forming an insulating layer on the first surface of the semiconductor substrate;
    forming an active layer on the insulating layer;
    selectively removing a portion of the semiconductor substrate so as to form a first boundary of a movable mass;
    providing a glass plate on the second surface of the semiconductor substrate;
    forming a plurality of openings on the active layer at a first region, the first region being located above the movable mass and occupying a predetermined space;
    selectively removing a portion of the insulating layer located under the first region in a wet-etching process through the plurality of openings so as to define a second boundary of the movable mass; and
    after said forming a plurality of openings, selectively removing a portion of the active layer to form a groove separating the first region from the movable mass, so as to form a third boundary of the movable mass, wherein the movable mass comprises a remaining portion of the semiconductor substrate, a remaining portion of the insulating layer, and a remaining portion of the active layer.

14. The method for fabricating a three-dimensional acceleration sensor, according to claim 13, wherein
    the step of providing a glass plate is carried out in an anodic bonding process.

15. The method for fabricating a three-dimensional acceleration sensor, according to claim 13, wherein
    the glass plate is pyrex glass.

16. The method for fabricating a three-dimensional acceleration sensor, according to claim 13, wherein
    the first region is a stopper which restricts over-move of the movable mass.

17. The method for fabricating a three-dimensional acceleration sensor, according to claim 16, wherein
    the movable mass is shaped to have corners, and
    the stopper comprises a plurality of members arranged around the corners of the movable mass.

18. The method for fabricating a three-dimensional acceleration sensor, according to claim 13, wherein the openings are shaped to be square.

19. The method for fabricating a three-dimensional acceleration sensor, according to claim 13, wherein
    the step of selectively removing the active layer is carried out also to separate the movable mass from a stationary frame and to shape beams which are coupled between the movable mass and the stationary frame.

20. The method for fabricating a three-dimensional acceleration sensor, according to claim 13, further comprising:

before forming the plurality of openings, forming a detecting device to detect motion of the movable mass and output an electrical signal corresponding to a degree of the motion.

21. The method for fabricating a three-dimensional acceleration sensor, according to claim 13, wherein
the insulating layer is partly remained within the groove so that the insulating layer comprises an extended region, which extends from the movable mass toward the first region.

22. The method for fabricating a three-dimensional acceleration sensor, according to claim 13, wherein
the step of providing a glass plate is carried out in vacuum condition.

23. A method for fabricating a three-dimensional acceleration sensor, comprising:
providing a semiconductor substrate having first and second surfaces;
forming an insulating layer on the first surface of the semiconductor substrate;
forming an active layer on the insulating layer;
selectively removing the semiconductor substrate to form a first boundary of a movable mass;
providing a glass plate on the second surface of the semiconductor substrate;
forming a plurality of openings on the active layer at a first region, which is to be located above the movable mass with a predetermined space;
selectively removing the insulating layer located under the first region so as to form a second boundary of the movable mass;
selectively removing the active layer to form a groove separating the first region from the movable mass, so as to form a third boundary of the movable mass, wherein the movable mass comprises a remaining portion of the semiconductor substrate, a remaining portion of the insulating layer, and a remaining portion of the active layer; and
selectively removing the insulating layer located under the groove after the step of removing the insulating layer located under the first region.

24. The method for fabricating a three-dimensional acceleration sensor, according to claim 23, wherein
the step of providing a glass plate is carried out in vacuum condition.

* * * * *

UNITED STATES PATENT AND TRADEMARK OFFICE
CERTIFICATE OF CORRECTION

PATENT NO.         : 7,237,316 B2
APPLICATION NO. : 11/182844
DATED                 : July 3, 2007
INVENTOR(S)      : Akihiro Sakamoto It is certified that error appears in the above-identified patent and that said Letters Patent is hereby corrected as shown below:

Title page, item 73 (Assignee)
Please change the listing Assignee to read as follows:

Oki Electric Industry Co., Ltd., Tokyo (JP)

Signed and Sealed this

Eleventh Day of September, 2007

JON W. DUDAS
*Director of the United States Patent and Trademark Office*